(12) United States Patent
Schillaci et al.

(10) Patent No.: US 6,919,252 B2
(45) Date of Patent: Jul. 19, 2005

(54) PROCESS FOR MANUFACTURING MOS SEMICONDUCTOR DEVICE HAVING INACTIVE ZONE WITH ALTERNATING THICKNESS SILICON OXIDE LAYER

(75) Inventors: Antonino Schillaci, Messina (IT); Paola Maria Ponzio, Gela (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/851,599

(22) Filed: May 21, 2004

(65) Prior Publication Data

US 2004/0211984 A1 Oct. 28, 2004

Related U.S. Application Data

(62) Division of application No. 10/251,907, filed on Sep. 20, 2002, now Pat. No. 6,750,512.

(30) Foreign Application Priority Data

Sep. 21, 2001 (EP) .............................................. 01830599

(51) Int. Cl.$^7$ ............................................ H01L 21/336
(52) U.S. Cl. ........................ 438/299; 438/301; 438/306; 438/527
(58) Field of Search ................................ 438/197, 229, 438/232, 279, 299, 301, 306, 527

(56) References Cited

U.S. PATENT DOCUMENTS

| | | | |
|---|---|---|---|
| 4,680,853 A | 7/1987 | Lidow et al. | |
| 5,237,194 A | 8/1993 | Takahashi | |
| 5,298,770 A | 3/1994 | Im | |
| 5,475,252 A | 12/1995 | Merrill et al. | |
| 6,054,737 A | 4/2000 | Magri et al. | |
| 6,093,588 A | 7/2000 | De Petro et al. | |
| 6,372,586 B1 * | 4/2002 | Efland et al. | ................ 438/301 |
| 6,506,648 B1 * | 1/2003 | Hebert et al. | ................ 438/286 |
| 6,525,383 B1 | 2/2003 | Stecher | |
| 6,531,355 B2 * | 3/2003 | Mosher et al. | ................ 438/227 |
| 6,639,276 B2 * | 10/2003 | Spring et al. | ................ 438/197 |
| 2002/0084486 A1 | 7/2002 | Chau et al. | |

FOREIGN PATENT DOCUMENTS

| | | |
|---|---|---|
| EP | 0 747 968 A1 | 12/1996 |
| EP | 0 780 897 A1 | 6/1997 |
| JP | 03235368 | 10/1991 |

OTHER PUBLICATIONS

European Search Report dated March 12, 2002 for European Patent Application No. 01830599.

* cited by examiner

Primary Examiner—Kevin M. Picardat
(74) Attorney, Agent, or Firm—Lisa K. Jorgenson; Stephen Bongini; Fleit, Kain, Gibbons, Gutman, Bongini & Bianco P.L.

(57) ABSTRACT

A MOS semiconductor device formed on a substrate of a first conductivity type is provided. The device includes active zones for elementary active elements, and at least one inactive zone suitable for electric signal input or output. The substrate is connected with the drain terminal of the device, and at least one of the elementary active elements includes a body region of a second conductivity type that is connected with the source terminal of the device. The at least one inactive zone includes a semiconductor region of the second conductivity type formed in the substrate and adjacent a surface of the substrate, a conductive layer located over the semiconductor region, and a silicon oxide layer located between the semiconductor region and the conductive layer. The silicon oxide layer has alternating first zones and second zones that are contiguous to each other, with the first zones having a greater thickness than the second zones.

8 Claims, 7 Drawing Sheets

PROCESS FOR MANUFACTURING MOS SEMICONDUCTOR DEVICE HAVING INACTIVE ZONE WITH ALTERNATING THICKNESS SILICON OXIDE LAYER

CROSS-REFERENCE TO RELATED APPLICATIONS

This application is a divisional of application Ser. No. 10/251,907, filed Sep. 20, 2002, now U.S. Pat. No. 6,750,512 which is based upon and claims priority from prior European Patent Application No. 01-830599.5, filed Sep. 21, 2001. The entire disclosures of application Ser. No. 10/251,907 and European Patent Application No. 01-830599.5 are herein incorporated by reference.

BACKGROUND OF THE INVENTION

1. Field of the Invention

The present invention relates to semiconductor devices, and more specifically to a high efficiency MOS semiconductor device and to a process for manufacturing the same.

2. Description of Related Art

In electronic devices, such as those for radio frequency applications, the signals must be treated so as to prevent alteration of the same inside the device. Therefore, in the devices all the factors that can bring about a perturbation of the signal waveform or which can add noise to the signal must be minimized. Such factors, in the radio frequency devices, must be researched in the presence of the parasitic capacitances and in problems linked to the main physic-structural parameters, as the problem related to the power dissipation of the MOS technology device in the stationary state which is linked to the resistance of the device in the on state (Rdson). Thereby, there is the exigency of researching structural solutions to allow the achievement of both an optimization of such physic-structural parameters and a parasitic capacitance reduction.

The parasitic capacitance reduction of MOS technology semiconductor devices is linked to the use of the prefixed thickness of the field or gate oxide layers and of the dielectric layers. Such devices include active zones for treating the radio frequency signal and other electric signals which are necessary for the device's operation, and inactive zones assigned, for example, to the output and the input of the electric signals, such as the "gate-bus" and "gate-pad". In such inactive zones, the main parasitic capacitance which must be reduced is represented by the gate-drain capacitance.

There is known the possibility of reducing such capacitance by forming shield regions (this is semiconductor regions doped with P-type dopant in the case of an N-channel MOS device) connected with the source terminal of the device, as shown in FIG. 1. In such figure, a final structure of a shielded pad is shown with a thick silicon oxide layer 11 (the even field oxide), a dielectric layer 12, a metal layer 13, and a passivation layer 14 only in the periphery parts of the structure. Such layers are placed over an N-type epitaxial layer 10 which constitutes the drain of the device and which is placed over a N-type substrate which is not shown.

In a central part A of the structure of FIG. 1, which constitutes the pad, the field oxide layer 11 has a lower thickness than in the periphery parts; this is due to the fact that, in the central part A, before the deposition of the dielectric layer 12, the field oxide layer 11 is attached and removed for providing an N-type dopant implant (typically there is used the same implant that allows the formation of a P-type semiconductor ring in the edge structure of the device). Successively, a thin silicon oxide layer 16 is formed in the central part A. After a P-type dopant diffusion, a P-type semiconductor well 15 is formed inside the N-type epitaxial layer and under the oxide layer of the central part, and the well is connected with the source terminal of the device.

In such a way, as shown in FIG. 2, the gate-drain capacitance Cgd is divided into a series of a gate-source capacitance Cgs due to the oxide layer and a drain-source differential capacitance Cds that changes according to the values of the potentials of the source and drain terminals. The capacitance Cgd changes essentially with the differential capacitance Cds when the source-drain voltage is not zero, while it depends principally on the capacitance Cgs when the source-drain voltage is zero. Since the capacitance Cgs is inversely proportional to the silicon oxide layer thickness, such capacitance will have a high value.

SUMMARY OF THE INVENTION

In view of the state of the art described above, it is an object of the present invention to provide a novel high efficiency MOS semiconductor device and a process for manufacturing the same.

One embodiment of the present invention provides a MOS semiconductor device formed on a substrate of a first conductivity type. The device includes active zones for elementary active elements, and at least one inactive zone suitable for electric signal input or output. The substrate is connected with the drain terminal of the device, and at least one of the elementary active elements includes a body region of a second conductivity type that is connected with the source terminal of the device. The at least one inactive zone includes a semiconductor region of the second conductivity type formed in the substrate and adjacent a surface of the substrate, a conductive layer located over the semiconductor region, and a silicon oxide layer located between the semiconductor region and the conductive layer. The silicon oxide layer has alternating first zones and second zones that are contiguous to each other, with the first zones having a greater thickness than the second zones.

Another embodiment of the present invention provides a method for manufacturing a MOS semiconductor device that includes the formation of elementary active elements in active zones of the device. According to the method, there is the masking and successive implantation and diffusion of dopant of a first conductivity type in a semiconductor substrate of a second conductivity type to form body regions of the elementary active elements. A field oxide layer is formed on the substrate in inactive zones of the device, and the field oxide layer in the inactive zones is masked and selectively attacked so as to remove the field oxide layer only in at least two selected parts. Dopant of the first conductivity type is implanted in the semiconductor substrate of the second conductivity type in the inactive zones in order to form semiconductor regions of the first conductivity type under the at least two selected parts of the field oxide layer. The dopant is thermally diffused in the substrate in order to merge together the adjacent regions of the first conductivity type and to simultaneously form silicon oxide in the at least two selected parts in order, so as to obtain a silicon oxide layer having an alternation of at least two first zones and at least two second zones that are contiguous between to each other, with the first zones having a greater thickness than the second zones. A conductivity layer is deposited over the silicon oxide layer.

The present invention makes it possible to form a high efficiency MOS semiconductor device that has a lower gate-drain capacitance in the inactive zones such as the gate-pad or the gate-bus.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 3:
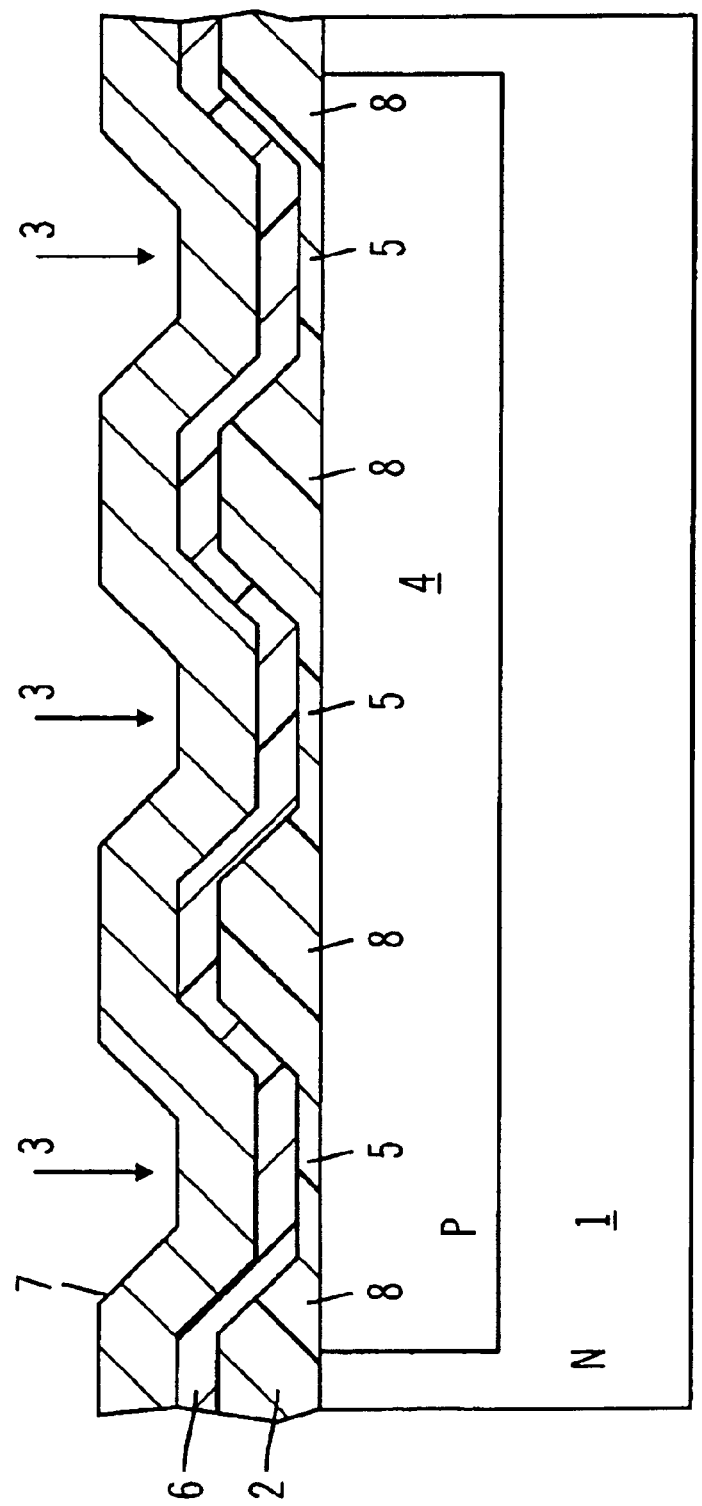
FIG. 3 is a cross-sectional view of an inactive zone of a semiconductor device according to a preferred embodiment of the present invention.

FIG. 3 shows an inactive zone of a MOS semiconductor device according to a preferred embodiment of the present invention. Such inactive zone, which is destined to become a gate-pad or a gate-bus for the output or the input of the signals, includes an N-type semiconductor substrate having in turn an N-type epitaxial layer 1 which is connected to the drain terminal. A deposition of a field oxide layer 2 (for example with a thickness of 10K angstroms) occurs over a top surface of the epitaxial layer 1, which successively, after appropriate masking, is attached and removed in certain zones 3.

Under the zones 3, P-type semiconductor wells are formed using a P-type dopant implant and, after a further thermal diffusion step to allow merging of the wells, one P-type region 4 is formed which is connected with the source terminal of the device. Such P-type dopant implant and diffusion is preferably obtained by using the same P-type dopant implant and diffusion steps which are necessary to form the body regions in the active zones of the device. The surface cover of the zones 3 with thin silicon oxide layers 5, which have been formed simultaneously with the dopant diffusion because of the field oxide diffusion, allows the formation of a silicon oxide layer having thick zones 8 and thin zones 5 which are alternated with and contiguous to each other. The silicon oxide layer is preferably covered by a dielectric layer 6, and a metal layer 7 is placed over the dielectric layer 6 in order to form the pad or the bus.

In such a way as shown in FIG. 3, the gate-drain capacitance Cgd is divided into the series of a gate-source capacitance Cgs due to the oxide layer and a drain-source differential capacitance Cds that changes according to the values of the potentials of the source and drain terminals. The capacitance Cgd changes essentially with the differential capacitance Cds when the source-drain voltage is not zero, while it depends principally on the capacitance Cgs when the source-drain voltage is zero. The semiconductor region 4 acts as a shield between the layer 1 connected with the drain terminal and the silicon oxide layer 2.

Figure 1:
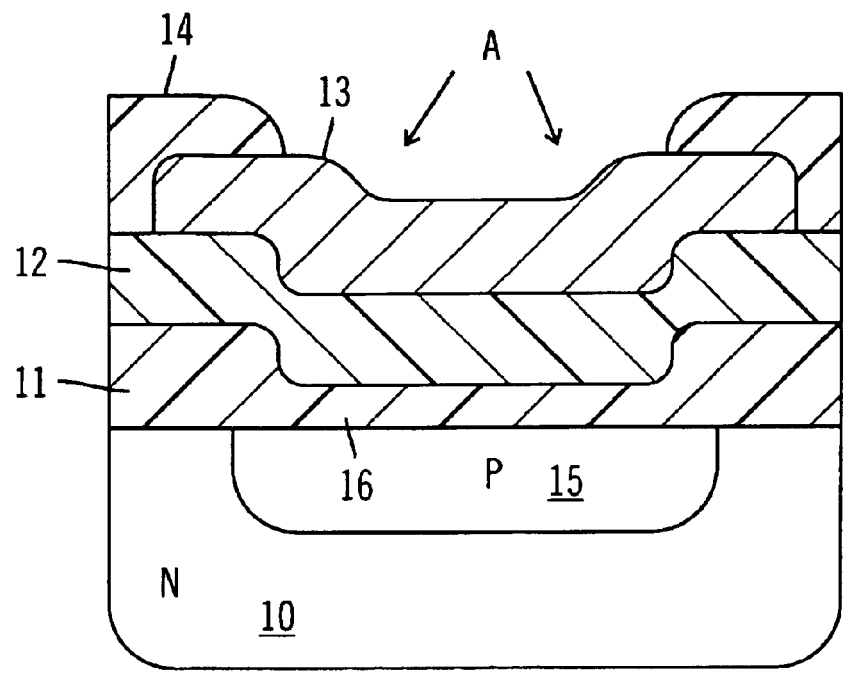
FIG. 1 is cross-sectional view of a gate-pad of a conventional MOS semiconductor device.
Figure 2:
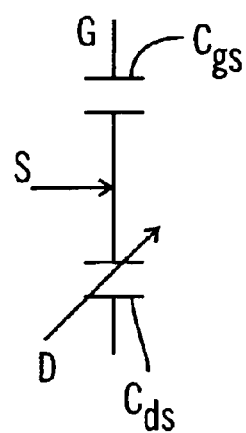
FIG. 2 is a schematic diagram of the capacitance of the gate-pad of FIG. 1.
Figure 9:
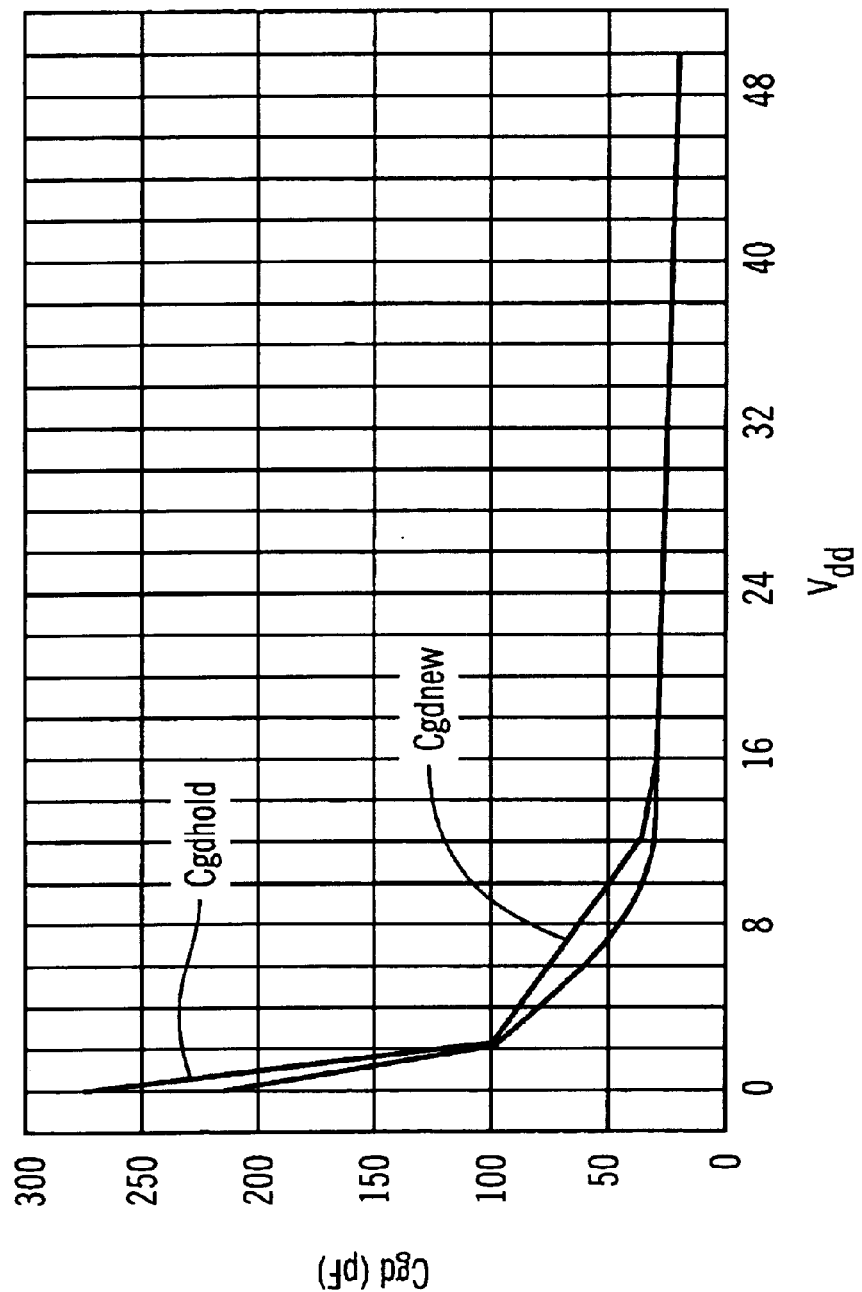
FIG. 9 is a diagram of the capacitance Cgd of the device according to invention and of a known device in function of the supply voltage.

The structure shown in FIG. 3 allows there to be obtained a good compromise between a not excessively high capacitance Cgd at 0 Volts and a very low capacitance Cgd at 50 Volts. FIG. 9 shows a graphic of the values of the capacitance Cgd as a function of the voltage between source and drain, which in this case is equal to the supply voltage Vdd, for the inactive zone in this embodiment of the present invention (indicated by Cgdnew), and for the pad of FIG. 1 (indicated by Cgdhold). It is possible to see that the capacitance Cgdnew assumes lower values than those of the capacitance Cgdhold with Vdd values equal to zero or next the zero, while with high Vdd values the capacitance Cgdnew is low.

Figure 8:
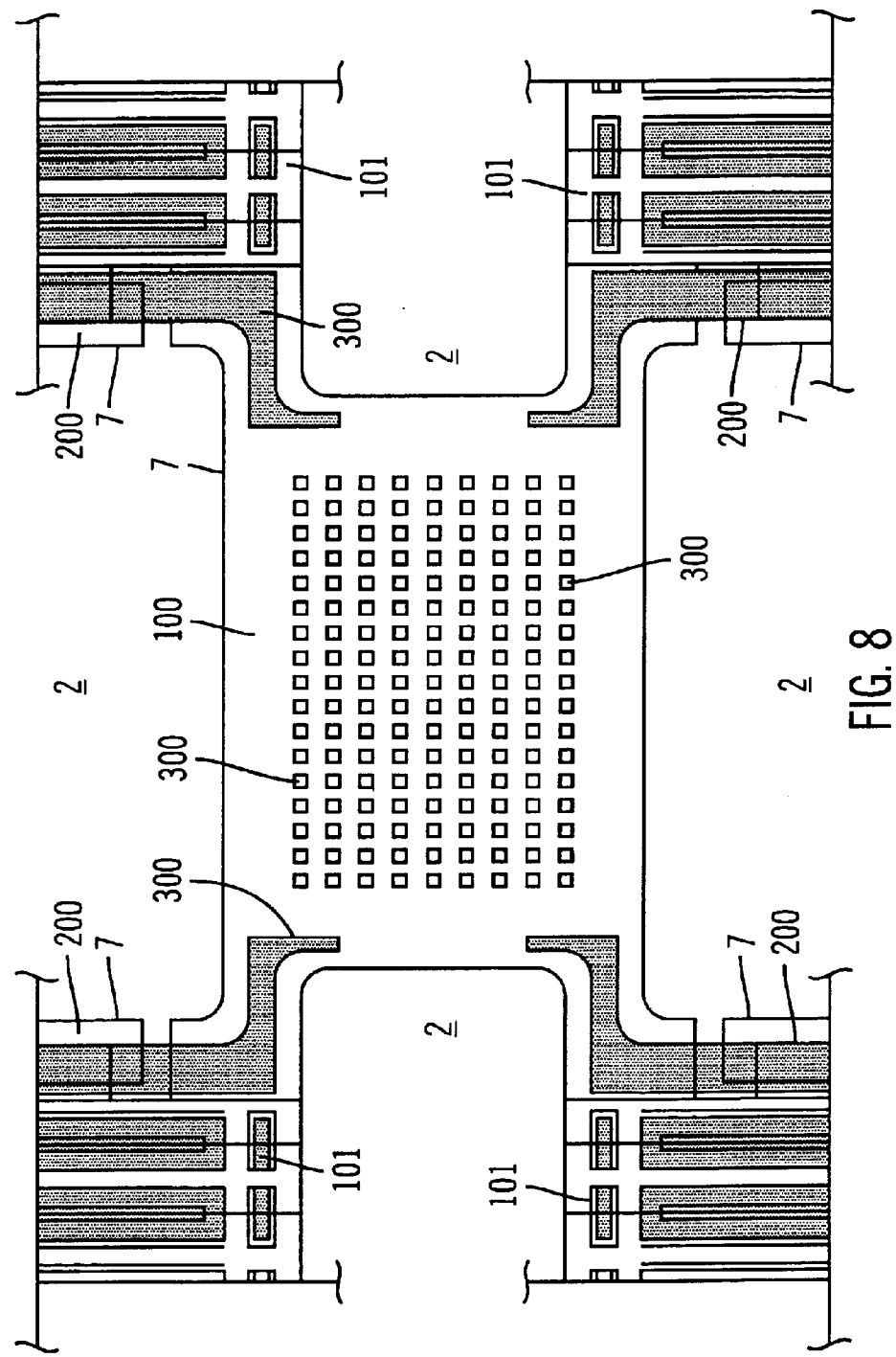
FIG. 8 is a layout of a part of the device according to invention in formation step.

In the structure shown, the implant of the P region can be perform without totally removing the oxide and by using an appropriate masking, such as masking 300 shown in FIG. 8. FIG. 8 shows a layout of a part of the device according to this embodiment of the present invention including a gate-pad zone 100, gate-bus zones 101, and active zones 200. The gate bus zones 101 are allocated on the periphery of the active zones 200 and allow carrying of the signal from the pad 100 into the active zones 200; the formation of the such gate-bus inactive zones 101 is totally similar to the formation of the gate-pad inactive zones 100 even if the masking parts 300 are greater than the masking parts 300 utilized for the gate-pad 100 in order to obtain greater P-type semiconductor regions after the dopant implant. The layout of FIG. 8 is not the final layout of the device according to this embodiment of the present invention but it is a layout of the device in the formation step and it includes the masking 300 for removing the field oxide 2 and the first metal layer 7.

Figure 4:
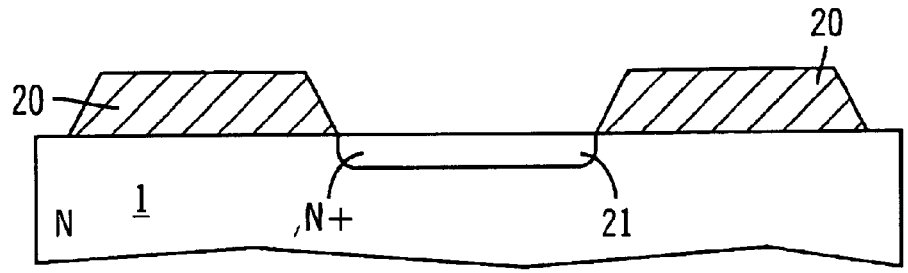
FIGS. 4–7 show sections of active regions of the semiconductor device during various manufacturing stages of a manufacturing process according to one embodiment of the present invention.

For improving the radio frequency characteristics of the device according to the present invention, it is possible to provide, during the manufacturing of the device, steps for forming regions which have the same conductivity as the substrate but which are enriched with dopant in the active zones of the device; in the case of an N-channel MOS device, N+ type semiconductor regions (called N+ enrichment regions) are obtained. In FIG. 4, an active zone of a device according to one embodiment of the present invention is partially shown in which an N+ type dopant implant (with doping, for example, on the order of $10^{12}$ atoms/cm$^3$) occurs over a central part of the N-type substrate 1 which is located between two field oxide 20 with consequent formation of an N+ type semiconductor well 21.

Figure 5:
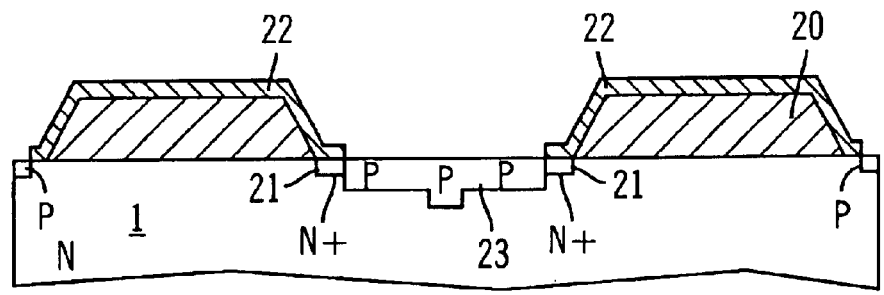
Figure 6:
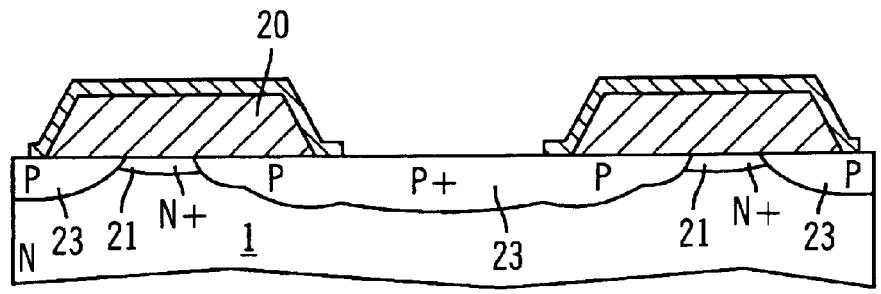
Figure 7:
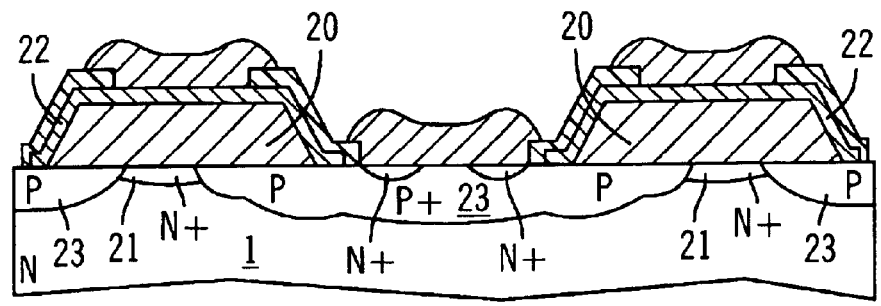

After a successive masking, there occurs a deposition of polysilicon 22 and successive P and P+ type dopant implant and appropriate masking for forming a body region 23 (FIG. 5). In this way, two small regions of the previous semiconductor well 21 remain under wings 24 of the polysilicon layer 22 which protrude with respect to the field oxide zones and which have protected such regions from the P-type dopant implant. The lateral thermal diffusion step allows the N+ type dopant of the regions 21, which remains under the polysilicon wings 24, to move under the field oxide zones 20 (FIG. 6). In FIG. 7, the final structure of the device active zone so obtained is shown.

Figure 10:
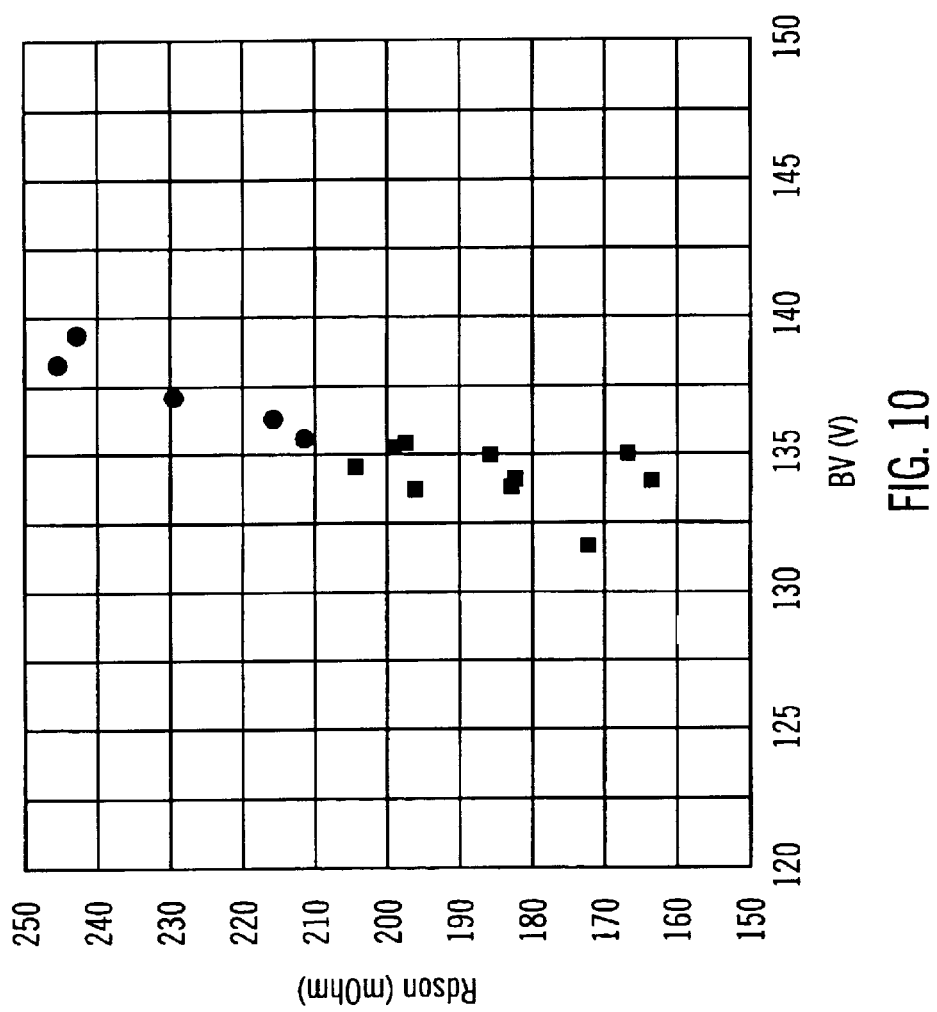
FIG. 10 is a diagram of the Rdson and the breakdown voltage of a device according to an embodiment of the present invention that is deprived of N+ enrichment regions.

The N+ type semiconductor zones under the field oxide zones allow an improvement of the Rdson of the device and prevent reduction of the breakdown voltage value that the device can withstand because such zones are formed for lateral diffusion and not for N+ direct implant. In FIG. 10, there can be seen the diagram of the Rdson and the breakdown voltage BV of a conventional device deprived of N+ enrichment regions (indicated graphically by squares) and of the device according to an embodiment of the present invention (indicated graphically by circles).

Figure 11:
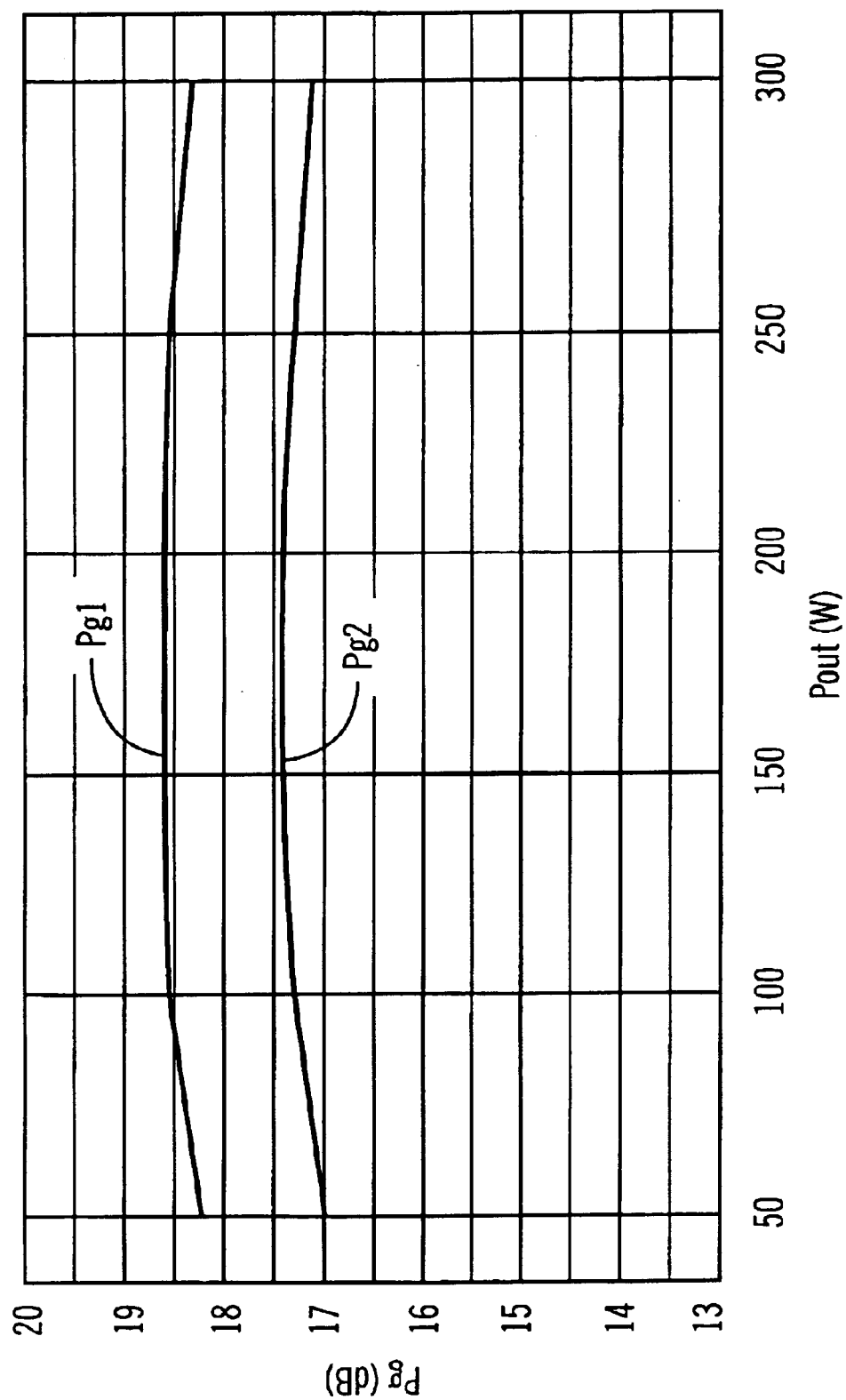
FIG. 11 is a diagram of the power gain of the device as a function of the output power.

In FIG. 11, there can be seen a diagram of the power gain Pg (in decibels) as a function of the output power Pout of the device according to an embodiment of the present invention (PG1) and for a conventional device (PG2).

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for manufacturing a MOS semiconductor device that includes the formation of elementary active elements in active zones of the device, said method comprising the steps of:
    masking and successive implantation and diffusion of dopant of a first conductivity type in a semiconductor substrate of a second conductivity type to form body regions of the elementary active elements;
    forming a field oxide layer on the substrate in inactive zones of the device;
    masking and selectively attacking the field oxide layer in the inactive zones so as to remove the field oxide layer only in at least two selected parts;
    implanting dopant of the first conductivity type in the semiconductor substrate of the second conductivity type in the inactive zones in order to form semiconductor regions of the first conductivity type under the at least two selected parts of the field oxide layer;
    thermally diffusing the dopant in the substrate in order to merge together the adjacent regions of the first conductivity type and to simultaneously form silicon oxide in the at least two selected parts in order, so as to obtain a silicon oxide layer having an alternation of at least two first zones and at least two second zones that are contiguous between to each other, with the first zones having a greater thickness than the second zones; and
    depositing a conductivity layer over the silicon oxide layer.

2. The method according to claim 1, wherein the steps of masking, implanting, and thermally diffusing in the inactive zones occur during the step of masking and successive implantation and diffusion of dopant of a first conductivity type in a semiconductor substrate of a second conductivity type to form body regions of the elementary active elements.

3. The method according to claim 1, wherein the body regions are formed in semiconductor zones located between field oxide zones.

4. The method according to claim 3, further comprising:
    before the implantation of dopant to form the body regions, implanting dopant of the second conductivity type to form heavily doped regions of the second conductivity type between the field oxide zones;
    depositing polysilicon over the field oxide zones and in part over the regions of the second conductivity type so that after the step of masking and dopant implant to form the body regions, heavily doped regions of the second conductivity type remain at the sides of the implanted body regions; and
    simultaneously to the step of lateral diffusion of the implanted dopant to form the body regions, laterally diffusing to form heavily doped regions of the second conductivity type which are located between the body regions and under and adjacent to the field oxide zones.

5. The method according to claim 1, wherein the substrate includes an epitaxial layer of the first conductivity type.

6. The method according to claim 1, wherein before the step of depositing a conductivity layer, depositing a dielectric layer over the silicon oxide layer.

7. The method according to claim 1, wherein the first conductivity type is P-type and second conductivity type is N-type.

8. The method according to claim 1, wherein the first conductivity type is N-type and second conductivity type is P-type.

* * * * *